US010326435B2

(12) United States Patent
Arp et al.

(10) Patent No.: US 10,326,435 B2
(45) Date of Patent: *Jun. 18, 2019

(54) DYNAMIC CONTROL OF EDGE SHIFT FOR DUTY CYCLE CORRECTION

(71) Applicant: International Business Machines Corporation, Armonk, NY (US)

(72) Inventors: Andreas H. A. Arp, Nufringen (DE); Fatih Cilek, Boeblingen (DE); Michael V. Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/854,985

(22) Filed: Dec. 27, 2017

(65) Prior Publication Data

US 2019/0097620 A1  Mar. 28, 2019

Related U.S. Application Data

(63) Continuation of application No. 15/714,438, filed on Sep. 25, 2017, now Pat. No. 10,063,222.

(51) Int. Cl.
| | |
|---|---|
| *H03K 3/017* | (2006.01) |
| *H03K 5/04* | (2006.01) |
| *H03K 7/08* | (2006.01) |
| *H03K 5/05* | (2006.01) |
| *H03K 5/159* | (2006.01) |
| *H03K 5/00* | (2006.01) |

(52) U.S. Cl.
CPC ............... *H03K 7/08* (2013.01); *H03K 5/05* (2013.01); *H03K 5/159* (2013.01); *H03K 2005/00058* (2013.01)

(58) Field of Classification Search
CPC ............ H03K 7/08; H03K 5/05; H03K 5/159; H03K 2005/00058
USPC .......................................................... 327/175
See application file for complete search history.

(56) References Cited

U.S. PATENT DOCUMENTS

| | | | |
|---|---|---|---|
| 7,705,647 | B2 | 4/2010 | Dai et al. |
| 7,839,194 | B2 | 11/2010 | Chang et al. |
| 7,990,194 | B2 | 8/2011 | Shim |

(Continued)

*Primary Examiner* — Metasebia T Retebo
(74) *Attorney, Agent, or Firm* — Jared C. Chaney

(57) ABSTRACT

A duty cycle correction device may be provided for correcting a duty cycle of an input signal. The device includes a first duty cycle correction circuit. The first duty cycle correction circuit receives the input signal. The first duty cycle correction circuit generates a first intermediate signal. The device includes a first programmable delay circuit. The first programmable delay circuit is controlled by a first delay control signal. The first programmable delay circuit receives the first intermediate signal. The first programmable delay circuit generates an output signal. The device includes a second duty cycle correction circuit. The second duty cycle correction circuit receives the input signal. The second duty cycle correction circuit generates a second intermediate signal. The device includes a second programmable delay circuit. The second programmable delay circuit generates a reference signal. The device includes a skew control arrangement operable for generating the first delay control signal.

9 Claims, 6 Drawing Sheets

(56) References Cited

U.S. PATENT DOCUMENTS

| | | |
|---|---|---|
| 8,018,261 B2 | 9/2011 | Becker et al. |
| 8,513,997 B2 | 8/2013 | Hesen et al. |
| 8,570,084 B2 | 10/2013 | Lin |
| 8,803,576 B2 | 8/2014 | Kitagawa |
| 9,048,823 B2 | 6/2015 | Bui et al. |
| 9,413,347 B1 | 8/2016 | Nien |
| 9,520,867 B2 | 12/2016 | Lin |
| 10,063,222 B1 * | 8/2018 | Arp .......................... H03K 7/08 |
| 2002/0070752 A1 | 6/2002 | Harrison |
| 2002/0196883 A1 | 12/2002 | Best et al. |
| 2008/0191767 A1 | 8/2008 | Koo |
| 2008/0272815 A1 | 11/2008 | Yeo et al. |
| 2010/0225372 A1 | 9/2010 | Satoh et al. |
| 2011/0248752 A1 | 10/2011 | Willey et al. |
| 2012/0019299 A1 * | 1/2012 | McLeod .............. H03K 5/1565 327/175 |
| 2012/0223754 A1 | 9/2012 | Lewis |
| 2013/0063191 A1 | 3/2013 | Patil et al. |
| 2013/0154702 A1 | 6/2013 | Kim et al. |
| 2014/0009197 A1 | 1/2014 | Yasuda |
| 2014/0333361 A1 | 11/2014 | Chau et al. |
| 2015/0002201 A1 | 1/2015 | Kitagawa et al. |
| 2015/0171834 A1 | 6/2015 | Arp et al. |
| 2015/0200655 A1 | 7/2015 | Kang et al. |
| 2015/0341021 A1 | 11/2015 | Ma |
| 2015/0364176 A1 | 12/2015 | Lee |
| 2016/0013785 A1 | 1/2016 | Nakata |
| 2016/0094205 A1 | 3/2016 | Aremallapur |
| 2017/0033746 A1 | 2/2017 | Lam et al. |
| 2017/0040986 A1 | 2/2017 | Ma |
| 2017/0093386 A1 | 3/2017 | Kitagawa |
| 2017/0111033 A1 | 4/2017 | Chae et al. |

* cited by examiner

DYNAMIC CONTROL OF EDGE SHIFT FOR DUTY CYCLE CORRECTION

BACKGROUND

The present invention relates, generally, to a duty cycle correction device, and more specifically, to a method for operating a skew control arrangement of a duty cycle correction device.

In electronics, duty cycle is the percentage of the ratio of a pulse duration, or pulse width (PW) to the total period (T) of a waveform. It is generally used to represent time duration of a pulse when it is high. In digital electronics, signals are used in rectangular waveform which are represented by logic 1 and logic 0. Logic 1 stands for presence of an electric pulse and logic 0 for absence of an electric pulse.

BRIEF SUMMARY

According to one aspect of the present invention, a duty cycle correction device for correcting a duty cycle of an input signal may be provided. The duty cycle correction device may include a first duty cycle correction circuit for correcting the duty cycle based on a first duty cycle control signal. The first duty cycle correction circuit receives the input signal. The first duty cycle correction circuit generates a first intermediate signal. The duty cycle correction device may include a first programmable delay circuit for compensating a phase misalignment caused by the first duty cycle correction circuit. The first programmable delay circuit is controlled by a first delay control signal. The first programmable delay circuit receives the first intermediate signal. The first programmable delay circuit generates an output signal. The duty cycle correction device may include a second duty cycle correction circuit. The second duty cycle correction circuit receives the input signal. The second duty cycle correction circuit generates a second intermediate signal. The duty cycle correction device may include a second programmable delay circuit. The second programmable delay circuit receives the second intermediate signal. The second programmable delay circuit generates a reference signal. An edge of the reference signal is delayed with respect to a corresponding active edge of the input signal by a delay that is at least equal to a sum of a maximum delay caused by the first duty cycle correction circuit and a minimum delay caused by the first programmable delay circuit. The duty cycle correction device may include a skew control arrangement operable for generating the first delay control signal from the output signal and the reference signal.

According to another aspect of the present invention, a semiconductor circuit comprising the just described duty cycle correction device may be provided.

According to a further aspect of the present invention, a method for operating a skew control arrangement of a duty cycle correction device may be provided. The duty cycle correction device may be used for correcting a duty cycle of an input signal. The duty cycle correction device may include a main signal path for generating an output signal from the input signal. The method may also include receiving the input signal and feeding it into a main signal path including a first duty cycle correction circuit and a first programmable delay circuit, correcting a duty cycle of the input signal based on a first duty cycle control signal fed to the first duty cycle correction circuit and compensating a phase misalignment by the first programmable delay circuit. Thereby, the phase misalignment may be caused by the duty cycle correction circuit. The first programmable delay circuit may be controlled by a first delay control or configuration signal.

The method may additionally include feeding the input signal also to a reference signal path in which a reference signal may be generated from the input signal. An edge of the reference signal may be delayed with respect to a corresponding active edge of the input signal by a delay that is equal to, or greater than, the sum of (a) a maximum delay caused by the delay of the first duty cycle correction circuit and (b) a minimum delay caused by the first programmable delay circuit. Furthermore, the method may include generating the first delay control signal from the output signal and the reference signal by a skew control arrangement such that a skew between corresponding edges of the output signal and the reference signal may be minimized.

BRIEF DESCRIPTION OF THE DRAWINGS

It should be noted that embodiments of the invention are described with reference to different subject-matters. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above and further aspects of the present invention, are apparent from the examples of embodiments to be described hereinafter and are explained with reference to the examples of embodiments, but to which the invention is not limited.

Figure 1:
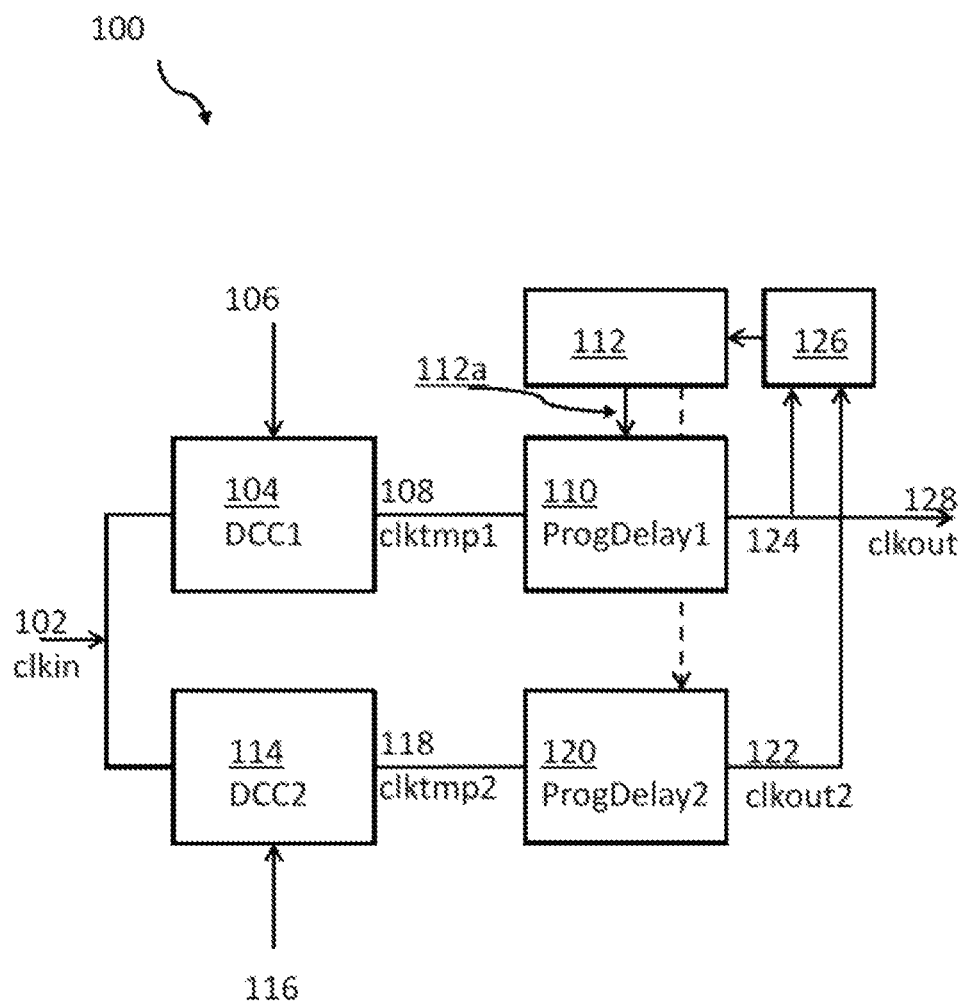
Figure 2:
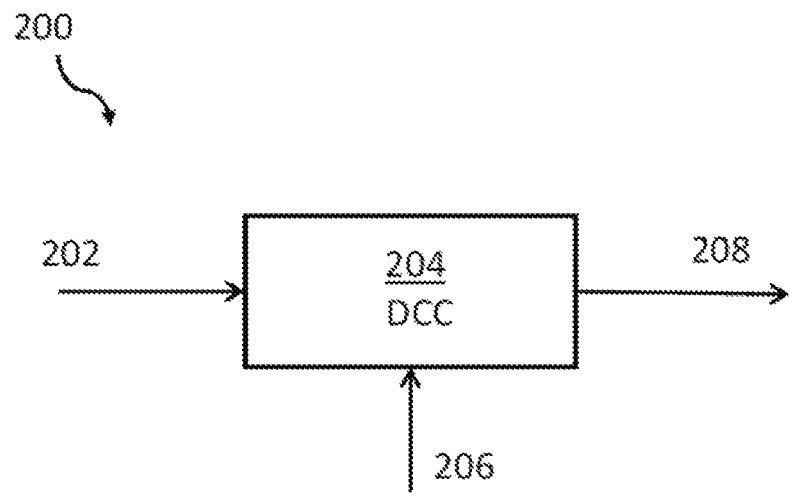
Figure 3:
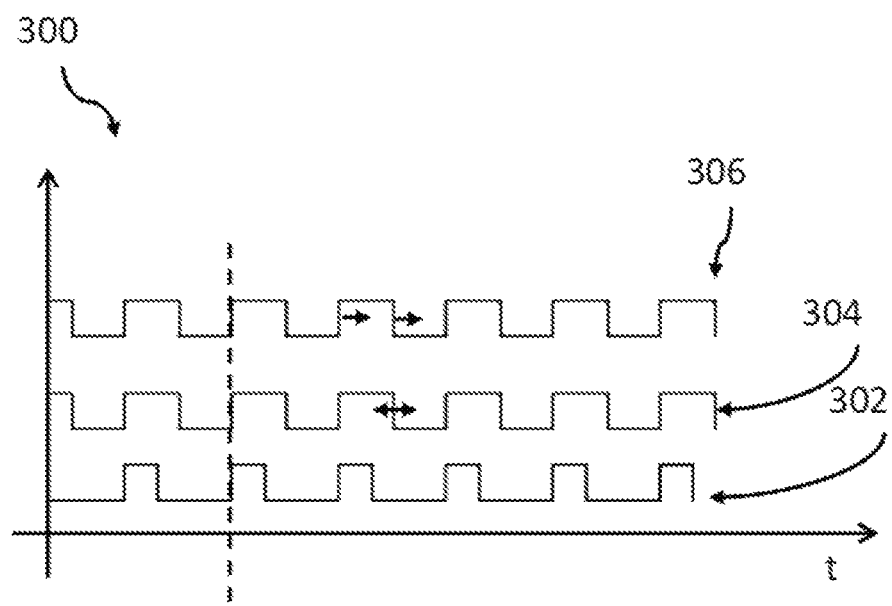
Figure 4:
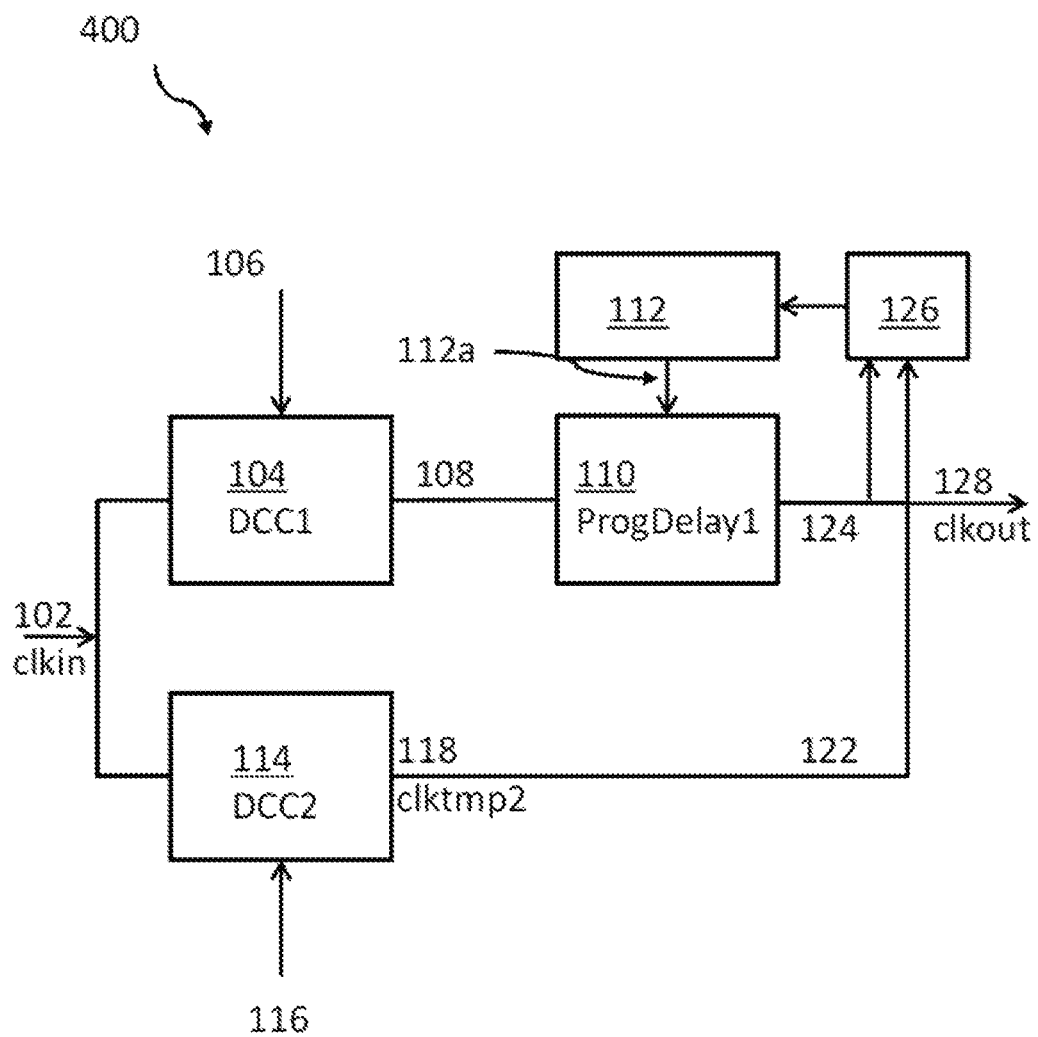
Figure 5:
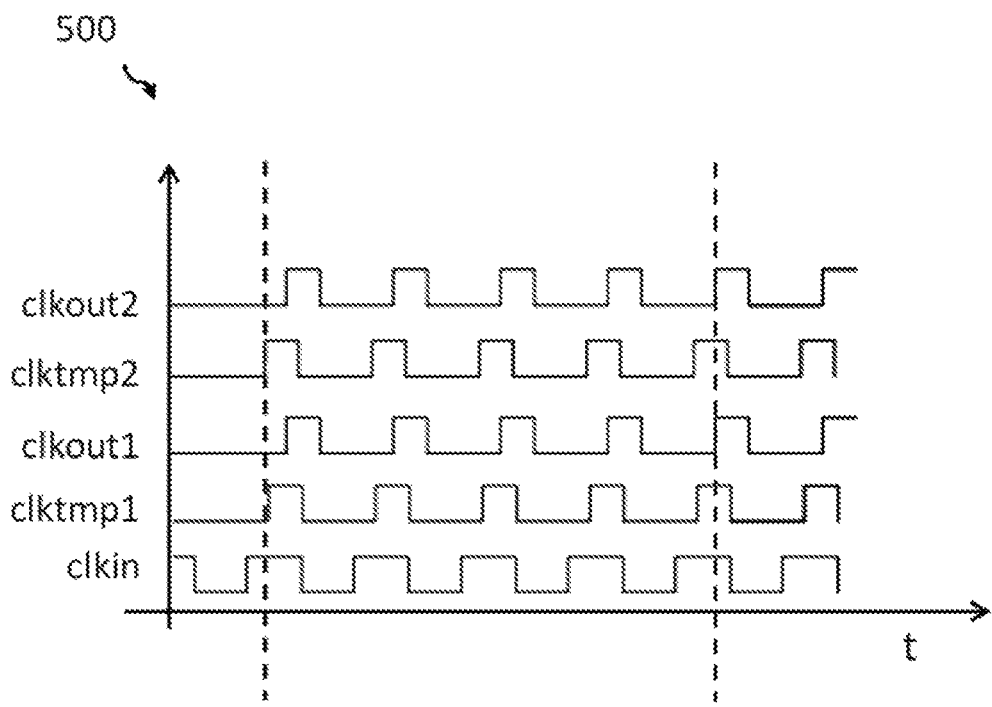
Figure 6:
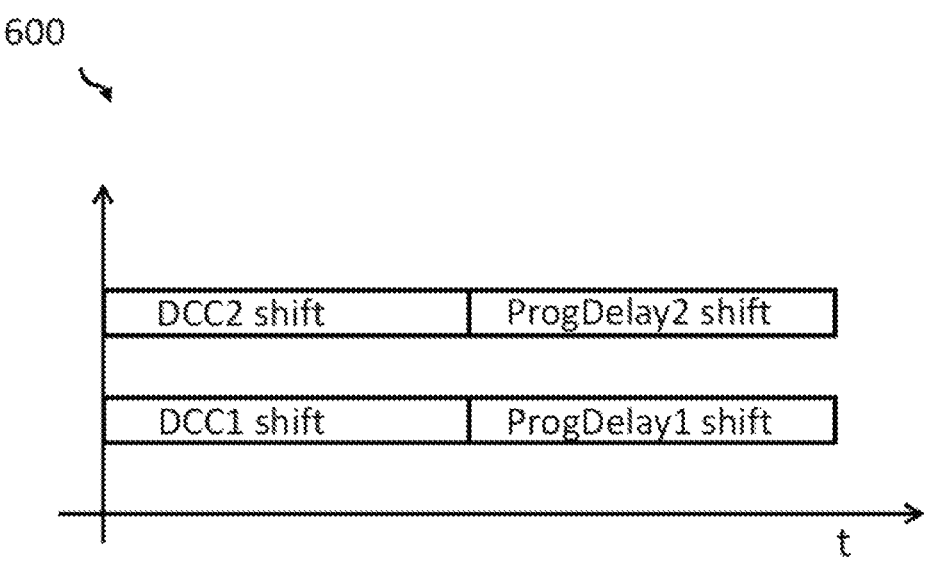
Figure 7:
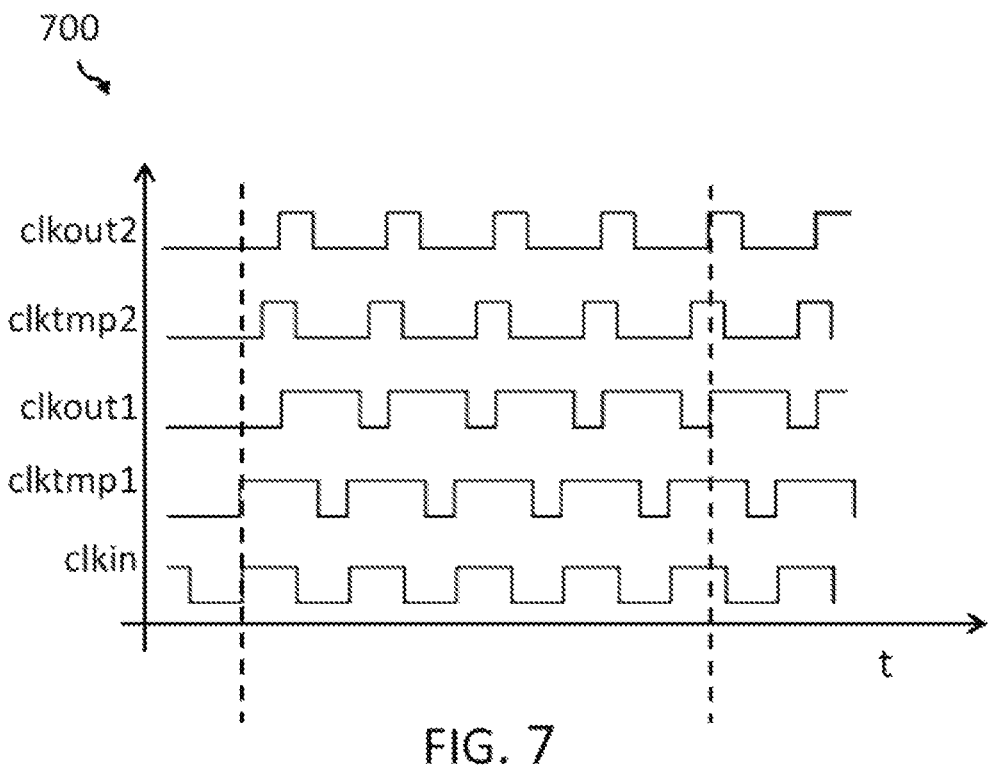
Figure 8:
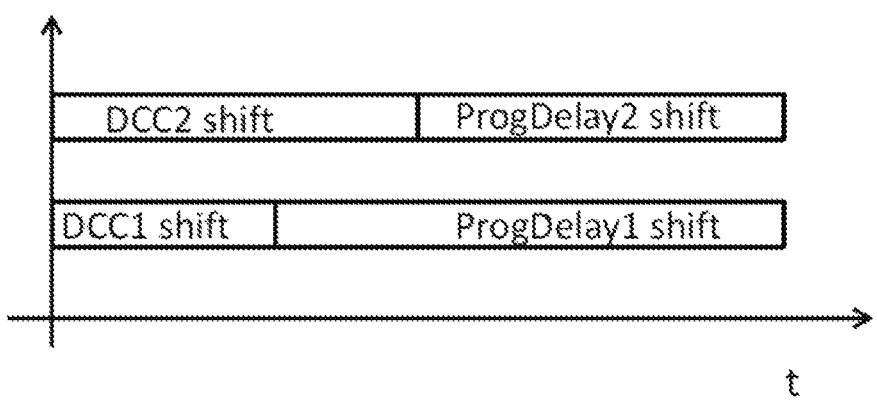
Figure 9:
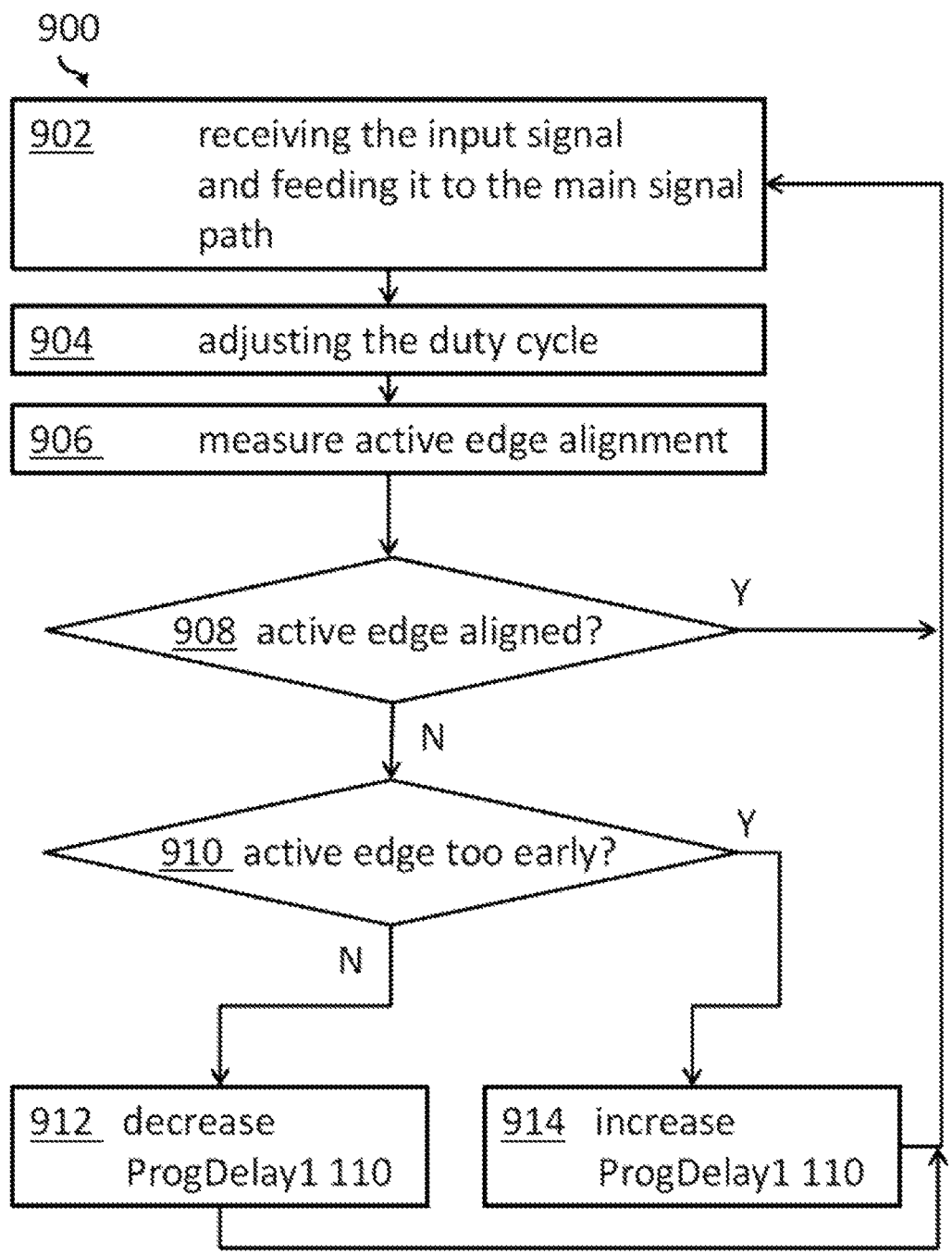

Preferred embodiments of the invention will be described, by way of example only, and with reference to the following drawings:

FIG. 1 shows one of the possible embodiments of the duty cycle correction device for correcting a duty cycle of an input signal;

FIG. 2 shows a simple block diagram of a basic duty cycle correction (DCC) circuit;

FIG. 3 shows a timing diagram corresponding to the basic DCC circuit of FIG. 2;

FIG. 4 shows an alternative embodiment of the duty cycle correction device;

FIG. 5 shows a timing diagram for an active rising edge for a minimum duty cycle;

FIG. 6 shows a view of the elements of the overall latencies for a minimal duty cycle;

FIG. 7 shows a timing diagram for an active rising edge for a maximum duty cycle;

FIG. 8 shows a view of the elements of the overall latencies for a maximal duty cycle; and FIG. 9 shows an exemplary flowchart of the general flow of action in the duty cycle correction device.

DETAILED DESCRIPTION

Designing digital circuits require a clear design of signal timing and the right sequence of signals dependent from each other. Special focus is often directed to investigating timing behavior, especially, on wave forms of critical signals, for example, clock signals. In complex chip designs, clock signals often run across multiple clock trees and clock meshes to different physical areas of a semiconductor die. In particular, rising and falling edges of signals require special attention. Getting this timing behavior of these critical signals of integrated circuits right is paramount for the functionality and reliability of very large-scale integrated circuit (VLSI) chips. Besides the signal waveform in general, the duty cycle is a relevant figure of merit and has to be monitored and potentially adapted to meet design requirements. For the duty cycle of signals—in particular clock signals—only a small variability may be acceptable. The clock signal(s) may be deformed by running through the clock trees and clock meshes. Thus, a "re-establishment" of the predefined duty cycle may be required.

To correct or change the duty cycle of signals, duty cycle correction (DCC) circuits are used. Typical DCC circuits receive an input signal as well as a configuration or control signal defining the desired duty cycle characteristics—in particular, the percentage of time the signal has the logical value "0" as well as the percentage of time the signal has the logical value of "1" within one cycle. In an ideal case, the DCC moves only the inactive edge of the signal or clock signal. However, due to the limitations of real electronic circuits which do not behave like ideal circuits, it appears that both edges—i.e., active or inactive—may be impacted.

It may be noted that in the context of this document the active edge of a clock signal may be the rising or the falling edge of the signal.

In the context of this description, the following conventions, terms and/or expressions may be used:

The term 'duty cycle correction device' may denote a device implemented as a portion of a semiconductor chip operable to correct a duty cycle of a signal. Typically, the signal may be a clock signal which may be degenerated when passing through a clock mesh or clock tree of a complex electronic circuit. The duty cycle correction device may—beside other components—comprise a duty cycle correction circuit.

The term 'duty cycle' may denote a percentage of time during which a signal may have the logical level "1" during one cycle. The remaining time of the cycle the signal may have logical level "0". Thus, a duty cycle of 30% has a "0 time" to "1 time" ratio that equals 7:3.

The term 'duty cycle correction circuit' may denote an electronic circuit designed to correct the duty cycle according to a specification and in line with predefined timing requirements. It may be a component of the duty cycle correction device.

The term 'programmable delay circuit' may denote an electronic circuit designed to delay a rising edge or a falling edge—or both—of a digital signal with a programmable or adjustable delay. The delay may be controllable by a delay control signal or a configuration signal.

The term 'reference signal path' may denote a signal path distinguishable from main signal path in the same device. Signals running through the main signal path and the reference signal path may be treated differently such that a difference may be detected at the end of the main path if compared to the signal of the reference signal path. Based on such a difference, specific action may be taken, e.g., change the timing/delay in the main signal path.

The term 'skew control arrangement' may denote an electronic circuit comprising, e.g., a skew detector—also named phase detector—adapted for determining a phase difference between at least two incoming signals and for generating an output signal according to the phase difference. This output signal may be used by a controller in order to generate a signal as input signal for a programmable delay circuit such that an active edge of a digital signal may be adjusted, i.e., delayed according to specifications.

The proposed duty cycle correction device may offer multiple advantages and technical effects:

The proposed duty cycle correction device may allow correcting a duty cycle of clock signals—or of any signal in general—with relative little effort by splitting the incoming signal into a main signal path and a reference signal path. Both paths have their special tasks: the main signal path may be responsible for getting the duty cycle corrected, and the reference path may solely focus on the range of allowable shifts of the active edge of the signal.

A skew detector—together with a controller—may be used to generate an input signal for a first programmable delay circuit in the main signal path. This way, an alignment (or also first-time adjustment) of the signal to the reference signal—in particularly a clock signal—is possible with only a few additional electronic circuits.

It may also be mentioned that the duty cycle correction circuit and the programmable delay circuit in the main signal path—as well as the programmable delay circuit in the reference signal path—may be exchanged in sequence. I.e., the incoming signal may first run through the DCC and then through the first programmable delay circuit, or the other way around. Additionally, the second programmable delay circuit in the reference signal path may not be required; it might even be removed if the load and timing effects can be implemented otherwise. The advantage of such an embodiment is the reduced requirement for additional electronic circuits and thus, for less design effort and energy consumption.

In state-of the-art techniques, the value of the DCC configuration signal was not changed continuously, but only after a relative long time has been used to measure the duty cycle. Taking this into account, there would be no need to change the delay value of a following programmable delay—like the first programmable delay circuit of the here proposed concept—continuously as well. Instead, a change of the DCC configuration signal might trigger the readjustment of the following programmable delay as well, which may minimize jitter introduced by the skew adjustment control loop consisting of the skew detector, the skew controller and the first programmable delay.

In contrast to such state-of-the-art solutions, the here proposed solution allows a continuous adjustment of the input value of the first duty cycle correction circuit and as a consequence, a continuous adjustment of the first programmable delay circuit based on a reference signal from the reference signal path. This way, a skew between a reference clock and an output clock can be controlled even if environmental parameters, like temperature or supply voltage, are changing.

In the following, additional embodiments of the inventive duty cycle correction device and the related method will be described:

According to one preferred embodiment of the duty cycle correction device, the reference signal path may include a second duty cycle correction circuit. Thus, the input stage of the main signal path and the reference signal path may be designed symmetrically. The second duty cycle correction circuit may be used to shift/delay the active edge of the incoming signal as much as possible.

According to another preferred embodiment of the duty cycle correction device, the reference signal path may include a second programmable delay circuit. This second programmable delay circuit may be instrumental to shift the complete signal of the main signal path having the corrected duty cycle according to specifications.

According to an advantageous embodiment of the duty cycle correction device, the skew control arrangement may include a skew detector and a skew control circuit. These two components may be portions of a closed loop for controlling the final shift of the output signal of the main signal path. For this, an output signal of the skew control circuit is fed to the first programmable delay circuit.

According to a permissive embodiment of the duty cycle correction device, the active edge may either be the rising edge of the corresponding signal or the falling edge of the corresponding signal. Thus, the proposed inventive concept may be used in various environments. It is not dedicated for only one type of active edge.

According to one optional embodiment of the duty cycle correction device, the first duty cycle correction circuit may be arranged before the first programmable delay circuit in the main signal path. However, it may also be possible to reverse the order of the two circuits: hence, the first duty cycle correction circuit may also be arranged after the first programmable delay circuit in the main signal path. Consequently, also in this respect the inventive concept is transparent and is usable in a flexible way independent of other design constraints.

The same may apply to the circuits in the reference signal path. According to one optional embodiment of the duty cycle correction device, the second duty cycle correction circuit may be arranged before the second programmable delay circuit in the reference path. Also, here—i.e., in the reference signal path—the sequence of circuits may be reversed: hence, according to one optional embodiment of the duty cycle correction device, the second duty cycle correction circuit may be arranged after the second programmable delay circuit in the reference signal path. Thus, for the reference signal path the same design freedom applies as for the main signal path.

In the following, a detailed description of the figures will be given. All instructions in the figures are schematic. Firstly, a block diagram of an embodiment of the inventive duty cycle correction device is given. Afterwards, further embodiment details, as well as embodiments of the method for operating a skew control arrangement of a duty cycle correction device, will be described.

FIG. 1 shows one of the possible embodiments of the duty cycle correction device 100 for correcting a duty cycle of an input signal 102, later also named clkin (clock in) because of the character of typically being a clock signal. The duty cycle correction device 100 comprises a main signal path for generating an output signal 128—later also named clkout (clock out)—from the input signal 102. The main signal path includes a first duty cycle correction circuit DCC1 104 for correcting a duty cycle based on a first duty cycle control signal 106. This first duty cycle control signal 106 can be an integer value—e.g. in form of 6 bits—but also 4 or 8 bits, or other suitable values are possible—defining the targeted duty cycle, i.e., the percentage of time the signal should have a logical value of "1" during a complete cycle.

As a result of the duty cycle correction, the output 108—also denoted as clktmp1—of the first duty cycle correction circuit DCC1 104 is an intermediate signal in the main signal path having the target duty cycle, but may not have the appropriate timing.

In order to adapt the timing, the duty cycle correction device 100 includes a first programmable delay circuit 110—also denoted as ProgDelay1—for compensating a phase misalignment caused by the duty cycle correction circuit 104. The first programmable delay circuit 110 is controlled by a first delay control signal 112a.

Additionally, the duty cycle correction device 100 further includes a reference signal path arranged for generating a reference signal—also denoted as clkout2 122—from the input signal 102. In this reference signal path, an edge of the reference signal is delayed—using DCC2 114 (receiving an configuration signal 116) in combination with the second programmable delay circuit ProgDelay2 120—with respect to a corresponding active edge—which may in particular be the rising or falling edge of the input signal 102—by a delay that is equal to, or greater than, the sum of (a) a maximum delay caused by the delay of the first duty cycle correction circuit 104 and (b) a minimum delay caused by the first programmable delay circuit 110, i.e., ProgDelay1 110. For the sake of simplicity, the timing diagram relating to the different circuits shows the rising edge of the signal as active edge. However, the inventive concept may also work with the falling edge being the active edge.

Furthermore, the duty cycle correction device 100 includes a skew control arrangement operable for generating the first delay control signal 112a from the output signal 128 of the duty cycle correction device 100 which is identical to the output signal 124 of the first programmable delay circuit 110 and the output signal 122—also denotable as reference signal 122 or clkout2—of the second programmable delay circuit ProgDelay2 120. This way, the skew between corresponding edges of the output signal 128 and the reference signal 122 is minimized.

Instrumental in the skew control arrangement is a skew detector 126 which receives the output signal 124 of the first programmable delay circuit ProgDelay1 110 as well as the output signal 122 of the second programmable delay circuit ProgDelay2 120. Another component of the skew control arrangement is the skew control circuit 112 which generates the first delay control signal 112a to influence the first programmable delay circuit 110. The skew detector 126 may, e.g., be implemented as a flip-flop.

Optionally, also the second programmable delay circuit ProgDelay2 120 may receive an input signal from the skew control circuit 112 (compare dashed line in FIG. 1). However, normally the delay of the second programmable delay circuit ProgDelay2 120 is set to a minimum. This may lead to the conclusion that this programmable delay circuit ProgDelay2 120 may not be required, as shown in FIG. 4. However, the second programmable delay circuit ProgDelay2 120 may allow additional adjustments of the output signal 128 for a correct timing.

In other words: In the main signal path, the duty cycle of the input signal 102 is set to a predefined value. DCC2—in the reference signal path—delays the active edge in the reference signal path to a maximum possible. Based on this, the signal having the corrected duty cycle—clktmp1 108—is delayed by the first programmable delay circuit 110 in order to have a constant delay of the active edge of the output signal 128 regardless of the configuration of the DCC1 104. The combination of the skew detector 126 and the skew control circuit 112 generates a control signal for influencing the delay of ProgDelay1 110 such that the time difference between signal 124, of the main signal path, and signal 122, of the reference signal path, is minimized.

FIG. 2 shows—for comprehensibility reasons—a simple block diagram 200 of a duty cycle correction (DCC) circuit 204. An input signal clkin 202 is fed to the DCC 204. A duty cycle configuration input 206 defines the target duty cycle ratio. The DCC 204 corrects the duty cycle of the input signal 202 and makes the duty cycle corrected signal available at the output 208.

FIG. 3 shows a timing diagram 300 corresponding to the basic DCC circuit 204 of FIG. 2. Signal 302 symbolizes the input signal with the duty cycle. One can easily recognize that the time the signals 302 is "1" is shorter that the time the signals is "0" because the duty cycle ratio is not 1:1 which is assumed to be the target duty cycle. Signal 304 shows an ideal output signal clkout. The double arrow may suggest that the falling edge of the signal may be moved backward or forward depending on the required duty cycle ratio as preset by the duty cycle configuration input 206 of FIG. 2. However, it should be accepted that it is highly unlikely (technically more or less impossible) to shift an edge of the signal to an earlier point in time—i.e., to the left side in relation to the t axis. In real world electronic circuits, falling and rising edges of signals may always be shifted to the right by delay circuits. Thus, a correction of a duty cycle by shifting the rising edge to the left is not a viable technical option.

In addition to the ideal output signal clkout 304, a real output signal real clkout 306 is also shown. Here, the circumstance just explained—i.e., rising or falling edge may never be shifted to the left—is indicated by arrows pointing to the right in respect to the time axis, so that the duty cycle corrected signal comes out with the correct duty cycle.

FIG. 4 shows an embodiment 400 of an alternative embodiment of the duty cycle correction device 100, as mentioned already in the context of FIG. 1. Here, the reference signals path comprises only the DCC2 114 from which output clktmp2 118 is directly fed to an input of the skew detector 126 in order to generate the first delay control signal 112a—using the skew control circuit 112—as input for the first programmable delay circuit 110 such that the time difference between signal 124 of the main signal path and signal 118 of the reference signal path is minimized.

FIG. 5 shows a timing diagram 500 for a maximal shift of the active rising edge. This is causing a shift of the active edge of clktmp1 (signal between DCC1 104 and ProgDelay1 110) of FIG. 1. Consequently, the wave forms and arrival times of clktmp1 (reference numeral 108) and clktmp2 (reference numeral 118) as well as cklout1 (reference numeral 124) and clkout2 (reference numeral 122) are similar.

FIG. 6 shows a view 600 on the elements of the overall latencies for clkout1 124 and clkout2 122 of FIG. 1, i.e., latencies between the DCC1 104, the first programmable delay circuit ProgDelay1 110, as well as, the DCC2 114 and the second programmable delay circuit ProgDelay2 120 for a minimum duty cycle.

FIG. 7 shows a timing diagram 700 for an active rising edge for the duty cycle cklout1 124, 128, respectively, of FIG. 1, for a maximum shift of the active edge caused by the first duty cycle correction circuit. It shows the situation where a maximum duty cycle for clkout1 124 is required, causing a minimal shift of the active edge of clktmp1 108. The alignment of the active edges is performed by delaying clktmp1 in a way that the active edges of clkout1 124 and clkout2 122 align, i.e., have no or only little, time difference.

FIG. 8 shows a view 800 of the elements of the overall latencies for clkout1 124 and clkout2 122, i.e., latencies between the first programmable delay circuit ProgDelay1 110, the DCC1 104, as well as, the DCC2 114 and the second programmable delay circuit ProgDelay2 120, of FIG. 1, for a maximum duty cycle. Here, a minimal delay of the active edge of DCC1 104 is compensated by a large delay of ProgDelay1 110.

It should again be mentioned that the inventive concept is not limited to the figures. Placing the programmable delay circuits ProgDelay1 110, ProgDelay2 120 in front of the DCCs 104, 114 or even integrating the programmable delay circuits ProgDelay1 110, ProgDelay2 120 into the DCCs 104, 114 provides a comparable solution.

In a typical application, the configuration value of DCC2 114 should be set to a static value which provides the maximum latency through DCC2 114. The second programmable delay circuit ProgDelay2 120 should be set to a minimum delay (which could be driven by the skew control circuit 112 or even be static by tying its inputs to the related value) or to a small delay. In the former case, the latency of the path through DCC1 104 and the first programmable delay circuit ProgDelay1 will be controlled to a minimum value, accepting here that a change in latency caused by any environmental effects, will traverse from clkin 102 to clkout1, 124.

In the former case, the latency of the path through DCC1 104 and the first programmable delay circuit ProgDelay1 110 will be constant and these environmental effects will not cause any shifts of the active edge of clkout1, 124, at the cost of an additional latency the path from clkin 102 to clkout1, 124.

If the value driven to the second programmable delay circuit ProgDelay2 120 is constant, i.e., by tying its inputs to "0" or "1", the implementation of the skew control circuit 112 will be easier, smaller and eventually faster at the cost of less flexibility, i.e., if the skew control circuit 112 drives the value of the second programmable delay circuit ProgDelay2 120, latency could be added dynamically if needed.

In respect to the method for operating a skew control arrangement of a duty cycle correction device for correcting a duty cycle of an input signal, the following can be summarized: the duty cycle correction device includes a main signal path for generating an output signal from said input signal. The method includes: receiving, the input signal and feeding it into a main signal path including a first duty cycle correction circuit and a first programmable delay circuit, correcting, a duty cycle of the input signal based on a first duty cycle control signal fed into the first duty cycle correction circuit and compensating a phase misalignment by the first programmable delay circuit. The phase misalignment may be caused by said duty cycle correction circuit. The first programmable delay circuit is controlled by a first delay control signal.

The method further includes feeding, the input signal also to a reference signal path in which a reference signal is generated, from the input signal. An edge of the reference signal is delayed with respect to a corresponding active edge of the input signal by a delay that is equal to, or greater than, said sum of (a) a maximum delay caused by the delay of the first duty cycle correction circuit and (b) a minimum delay caused by the first programmable delay circuit.

Additionally, the method includes generating, the first delay control signal from the output signal and the reference signal by a skew control arrangement such that a skew between corresponding edges of said output signal and the reference signal is minimized.

Because of the real-time nature of the just described method or process for correcting a duty cycle of an input signal, some of the activities may run concurrently. Therefore, the dependencies of the activities may be better described in the form of the flowchart 900 of FIG. 9.

The process starts at 902 by receiving an input signal and feeding it to the main signal path. The duty cycle of the signal is adjusted, 904—using the first DCC, as described above. Next, the alignment of the active edge is measured, 906. Based on this measurement, it is determined, 908, whether the active edge is aligned with reference edge. If this is the case—"Y"—the process goes back to be beginning.

If this is not the case—case "N"—it is determined, 910, whether the signal in the main signal path arrives too early. If this is not the case—case "N"—the first programmable delay ProgDelay1 (compare reference sign 110 of FIG. 1) is decreased, 912, and the processes starts immediately again at the beginning. If the active edge in the main signal path arrives too early—determination 910—the first programmable delay ProgDelay1 110 is increased, 914, and the processes starts at the beginning.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method for operating a skew control arrangement of a duty cycle correction device for correcting a duty cycle of an input signal, wherein the duty cycle correction device comprises a signal path for generating an output signal from the input signal, the method comprising:
   receiving the input signal;
   feeding the input signal into a main signal path, wherein the main signal path comprises a first duty cycle correction circuit and a first programmable delay circuit;
   correcting a duty cycle of the input signal based on a first duty cycle control signal fed to the first duty cycle correction circuit;
   compensating a phase misalignment by the first programmable delay circuit, wherein the phase misalignment is caused by the first duty cycle correction circuit, and wherein the first programmable delay circuit is controlled by a first delay control signal;
   feeding the input signal also to a reference signal path in which a reference signal is generated from the input signal, wherein an edge of the reference signal is delayed with respect to a corresponding active edge of the input signal by a delay that is at least equal to a sum of a maximum delay caused by the first duty cycle correction circuit and a minimum delay caused by the first programmable delay circuit; and
   generating the first delay control signal from the output signal and the reference signal by a skew control arrangement.

2. The method of claim 1, further comprising:
   arranging a second duty cycle correction circuit in the reference signal path; and
   arranging a second programmable delay circuit in the reference signal path.

3. The method of claim 1, wherein the skew control arrangement comprises a skew detector and a skew control circuit.

4. The method of claim 3, further comprising:
   feeding an output signal of the skew control circuit to the first programmable delay circuit.

5. The method of claim 1, further comprising:
   arranging the first duty cycle correction circuit before the first programmable delay circuit in the main signal path.

6. The method of claim 1, further comprising:
   arranging the first duty cycle correction circuit after the first programmable delay circuit in the main signal path.

7. The method of claim 2, further comprising:
   arranging the second duty cycle correction circuit before the second programmable delay circuit in the reference signal path.

8. The method of claim 2, further comprising:
   arranging the second duty cycle correction circuit after the second programmable delay circuit in the reference signal path.

9. The method of claim 1, wherein a skew between corresponding edges of the output signal and the reference signal is minimized in response to the first delay control signal.

* * * * *